United States Patent [19]
Cabler

[11] Patent Number: 5,442,354
[45] Date of Patent: Aug. 15, 1995

[54] FOURTH-ORDER CASCADED SIGMA-DELTA MODULATOR

[75] Inventor: Carlin D. Cabler, Austin, Tex.

[73] Assignee: Advanced Micro Devices, Inc., Sunnyvale, Calif.

[21] Appl. No.: 171,091

[22] Filed: Dec. 21, 1993

Related U.S. Application Data

[63] Continuation-in-part of Ser. No. 147,062, Nov. 3, 1993, which is a continuation-in-part of Ser. No. 112,610, Aug. 26, 1993, Pat. No. 5,414,424.

[51] Int. Cl.⁶ .............................................. H03M 3/02
[52] U.S. Cl. ..................................... 341/143; 375/254
[58] Field of Search ............................. 341/118, 143; 375/25-34

[56] References Cited

U.S. PATENT DOCUMENTS

| | | | |
|---|---|---|---|
| 4,920,544 | 4/1990 | Endo et al. | 375/26 |
| 5,061,928 | 10/1991 | Karema et al. | 341/143 |
| 5,065,157 | 11/1991 | Ribner et al. | 341/143 |
| 5,084,702 | 1/1992 | Ribner | 341/143 |
| 5,148,166 | 9/1992 | Ribner | 341/143 |
| 5,148,167 | 9/1992 | Ribner | 341/143 |
| 5,153,593 | 10/1992 | Walden et al. | 341/143 |
| 5,283,278 | 2/1994 | Ribner et al. | 341/143 |
| 5,298,900 | 3/1994 | Mauthe et al. | 341/143 |

OTHER PUBLICATIONS

Matsuya, et al., "A 16-Bit Oversampling A-to-D Conversion Technology Using Triple-Integration Noise Shaping", IEEE Journal of Solid State Circuits, vol. SC-22, No. 6, pp. 921-929, Dec. 1987.

Ribner, et al., "A Third-Order Multistage Sigma-Delta Modulator With Reduced Sensitivity To Nonidealities", IEEE Journal of Solid-State Circuits, vol. 26, No. 12, pp. 1764-1774, Dec. 1991.

Chao, et al., "A Higher Order Topology For Interpolative Modulators For Oversampling A/D Converters", IEEE Transactions on Circuits and Systems, vol. 37, No. 3, pp. 309-318, Mar. 1990.

*Primary Examiner*—Marc S. Hoff
*Attorney, Agent, or Firm*—Fulbright & Jaworski

[57] ABSTRACT

A method of cascading two second-order sigma-delta modulators includes the steps of feeding the input to the quantizer of the first stage to the second stage. This input is, effectively, the difference between the output of the first second-order loop and the quantization noise of the first modulator. The method also includes the step of removing both the quantization noise from the first loop as well as the output from the first loop from a final output, $y_{out}$.

2 Claims, 4 Drawing Sheets

FOURTH-ORDER CASCADED SIGMA-DELTA MODULATOR

CROSS-REFERENCE TO RELATED APPLICATIONS

This application is a continuation-in-part of U.S. patent application No. 08/147,062, filed on Nov. 3, 1993 which is a continuation-in-part of U.S. patent application No. 08/112,610, filed Aug. 26, 1993, now U.S. Pat. No. 5,414,424. U.S. patent application No. 08/147,062 and U.S. patent application No. 08/112,610 are assigned to the assignee of the present invention and are incorporated herein in their entirety by this reference.

BACKGROUND OF THE INVENTION

1. Field of the Invention

The present invention relates generally to sigma-delta modulators. More particularly, the present invention relates to methods of cascading sigma-delta modulators.

2. Description of Related Art

As discussed in greater detail in the related applications, high-order sigma-delta modulators have recently become increasingly interesting in audio and ISDN applications. In part, this is because the introduction of high-order modulators in audio and ISDN equipment and apparatus increases the number of integrations to be carried out, which results in a decrease in the noise level of the passband, with the quantization noise shifted to a higher frequency level. This technique, often referred to as "quantization noise shaping through integration", provides an improved signal-to-noise ratio and improved precision.

Karema et al., in U.S. Pat. No. 5,061,928, have introduced a fourth-order topology which comprises a cascade of two second-order modulators. This is shown in FIG. 1 wherein the two second-order modulators are each generally designated with reference numeral 10. As shown therein, a gain of 1/C (in the form of gain element 12) has been added between the two modulators in order to prevent overflow of the second modulator. As in certain other prior art modulators discussed in greater detail in the related applications, a digital circuit is added to Karema et al.'s cascade. This circuit, generally designated by reference numeral 14, is set forth at the bottom of FIG. 1. This circuit combines the quantized outputs of the two second-order sections $y_1$, $y_2$ in such a manner that the quantization error of the second modulator receives fourth-order shaping. Algebraically, if the input to the converter is given as x and the quantization error of the second modulator is given as $E_2$, the output y can be expressed as:

$$y = z^{-4}x + C(1-z^{-1})^4 E_2.$$

In pending U.S. patent application Ser. No. 08/112,610, the inventor of the present invention teaches a system and method for cascading three sigma-delta modulators. This system and method involves applying an error signal representing the quantization error of a preceding modulator to a subsequent modulator. The error signal is scaled by a factor before being applied to a subsequent modulator. The quantized error signal of the subsequent modulator is then scaled by the reciprocal of the original scaling factor before being combined with the quantized outputs of the previous modulators. Combining the quantized outputs of the three modulators is performed so as to cancel the quantization error of the previous stages while shaping the noise at the last stage so that most of the noise is placed at high frequencies.

In pending U.S. patent application Ser. No. 08/147,062, the inventor of the present invention improved upon the system and method discussed in the immediately preceding paragraph. This improved system and method involves feeding the input of the quantizer of each stage to the subsequent stage. A difference between the output of each quantizer and the input of each quantizer need not be obtained. The signal which is fed to each of the subsequent stages is the difference between the output of the previous stage and the quantization noise of the previous stage. A correction network which removes both the quantization noise of the first two stages, as well as the output of the first two stages, is included. The final output of modulators so cascaded is a delayed version of the input thereto, plus a scaled version of the last stage which has been shaped with a fourth-order high pass function.

Based upon the foregoing, it should be understood and appreciated that fourth-order sigma-delta modulators have important advantages over lesser order modulators in certain applications. Further on this point, the signal-to-noise ratio (SNR) of ideal sigma-delta modulators is given by the following equation:

$$SNR = (2L+1) \ 10 \log (OSR) \log (\pi^{2L}/2L+1)$$

where OSR is the oversampling ratio and L is the order of the modulator. For example, if L=3 and the OSR=64, the SNR equals 105 dB. If L=4 and the OSR=64, the SNR equals 132.3 dB. Thus, a fourth-order loop has more inherent margin for 16-bit performance that does a third-order loop with the same oversampling ratio.

Although fourth-order sigma-delta modulators, such as those discussed above, have heretofore been proposed, it is a shortcoming and deficiency of the prior art that there are not additional types of such modulators to use.

SUMMARY OF THE INVENTION

The present invention overcomes the shortcoming and deficiency mentioned above by providing a new high-order sigma-delta modulator system. According to the teachings of the present invention, in a fourth-order sigma-delta modulator system comprised of two second-order modulators only the input to the first quantizer of the first second-order loop is fed to the input of the second second-order loop. Further according to the teachings of the present invention, correction logic is included to remove both the quantization noise from the first loop as well as the output from the first loop.

More specifically, the present invention provides a method of cascading two second-order sigma-delta modulators, each of which constitutes a stage, and each of which has a quantizer, which method includes the steps of obtaining the input to the quantizer of the first stage, feeding that input to the second stage, and feeding the output of both the first and second stages to a correction network that acts at least in part to remove the quantization noise and the output from the first stage.

The present invention also provides a sigma-delta modulator system including two second-order sigma-delta modulators, each of which constitutes a stage and each of which has a quantizer, which system includes means for obtaining the input to the quantizer of the first stage, means for feeding that input to the second stage, and means for feeding the output of both the first and second stages to a correction network that acts at least in part to remove the quantization noise and the output from the first stage.

Embodiments of the present invention offer a number of advantages over prior art systems. If an embodiment of the present invention, rather than a prior art system, is used in an analog-to-digital (A/D) system, fewer capacitors are required. This result leads to reduced costs, simpler manufacture, and facilitated construction.

Accordingly, an object of the present invention is to provide a new type of fourth-order sigma-delta modulator.

Another object of the present invention is to provide a D/A converter in which fewer subtractions must take place between stages as compared to prior art D/A converters.

Yet another object of the present invention is to provide an A/D converter in which fewer capacitors must be used as compared to prior art A/D converters.

BRIEF DESCRIPTION OF THE DRAWINGS

Other objects, advantages, and novel features of the present invention may best be understood by reference to the following detailed description taken in conjunction with the accompanying drawings in which.

DETAILED DESCRIPTION OF THE INVENTION

Figure 2:
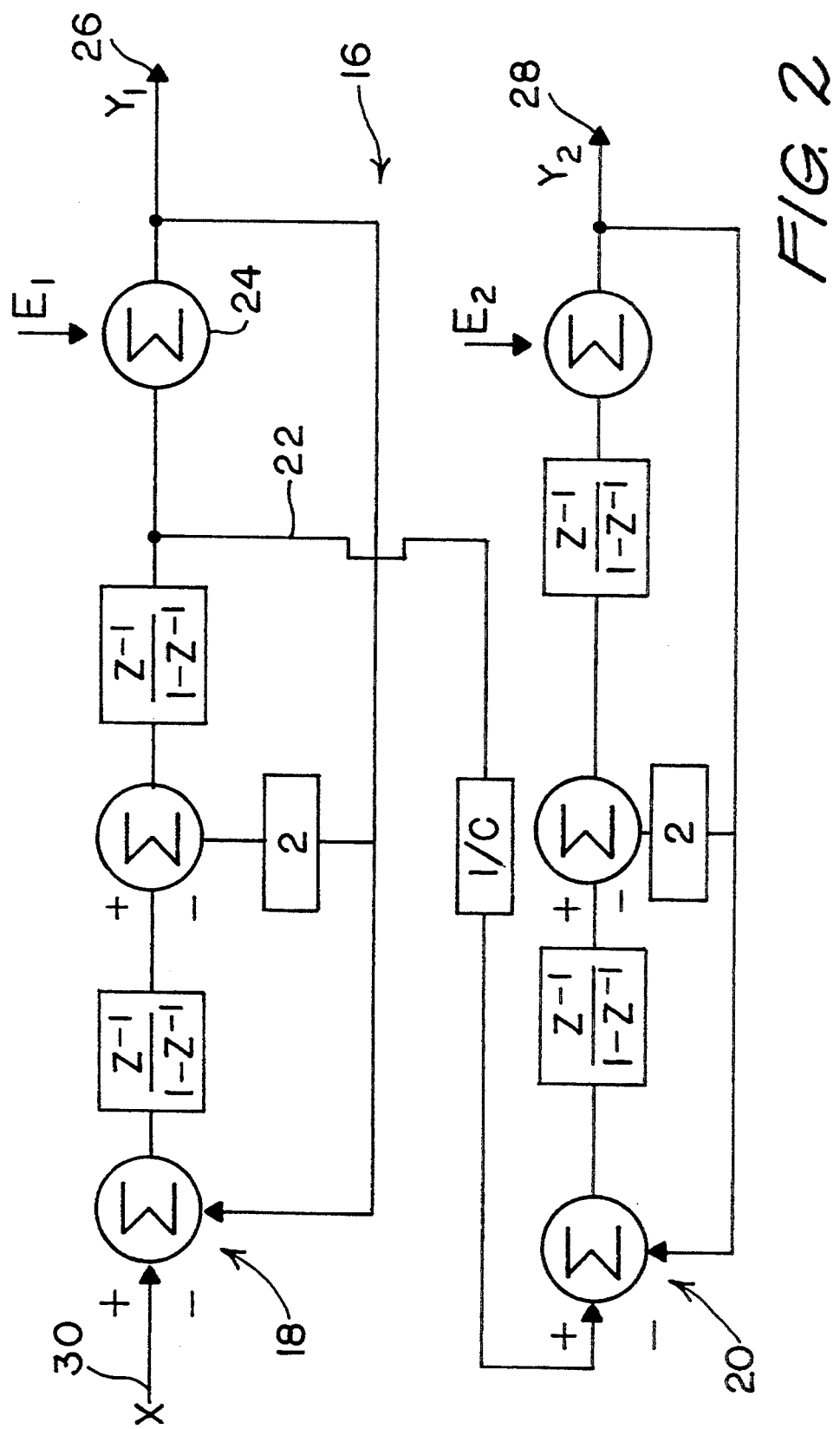
FIG. 2 is a schematic diagram of an embodiment of the present invention.

Referring now to the drawings wherein like or similar elements are designated with identical reference numerals throughout the several views and, more particularly, to FIG. 2, there is shown a schematic diagram of an embodiment of the present invention generally designated by reference numeral 16.

The embodiment 16 comprises a first conventional second-order sigma-delta modulator (generally designated by reference numeral 18) and a second conventional second-order sigma-delta modulator (generally designated by reference numeral 20).

Figure 1:
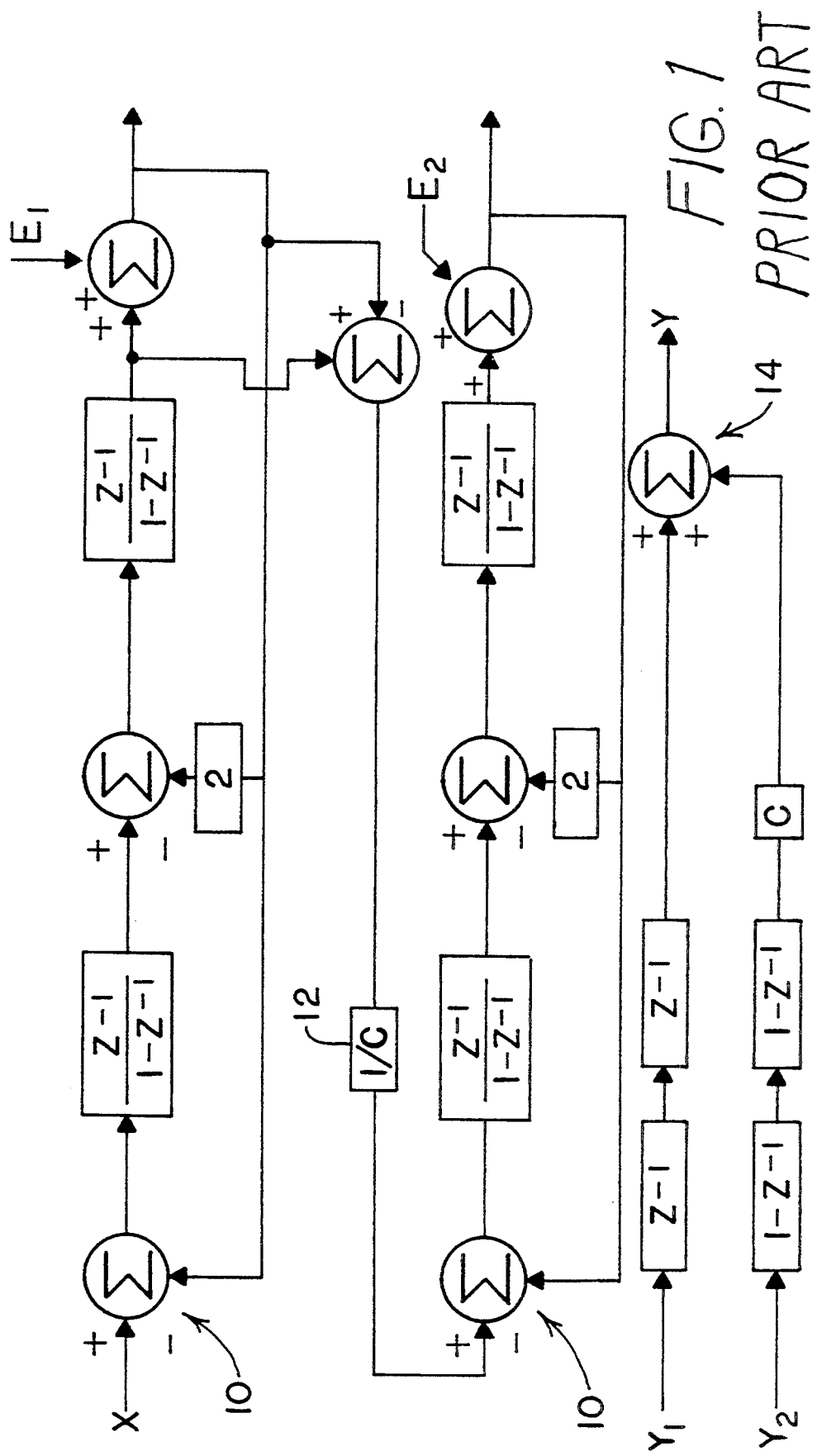
FIG. 1, previously described, is a schematic diagram of a prior art fourth-order sigma-delta modulator topology which comprises a cascade of two second-order modulators.

There are two fundamental differences between the embodiment of the present invention depicted in FIG. 2 and the system of Karema et al. depicted in FIG. 1. First, Karema et al. develops an error signal by taking the difference between the input of the quantizer of the first modulator and the output of the first modulator. This error signal is then fed to the input of the second second-order modulator. According to the teachings of the present invention, on the other hand, only the input to the first quantizer (on line 22 in FIG. 2) is fed to the input of the second second-order loop. This provides several advantages. One such advantage, with respect to use as an A/D converter, is that fewer capacitors are required. This simplifies manufacturing and construction, and lowers cost. The input to the quantizer (i.e., element 24 in FIG. 1) of the first loop can be described as $y_1-E_1$, that is, it is the difference between the output of the first second-order loop and the quantization noise, $E_1$, of the quantizer 24.

The second major difference between the embodiment of the present invention depicted in FIG. 2 and the system of Karema et al. depicted in FIG. 1 resides in the correction logic. Because the output of the second second-order loop 20 contains a term which has the output of the first second-order loop in it, the correction logic must remove both the quantization noise from the first loop as well as the output from the first loop. More specifically, as is well known to those skilled in the art, the standard equation for a second-order sigma-delta modulator is:

$$y = z^{-2}x + (1-z^{-1})^2 E$$

where E is the quantization error. Based upon that fact, and with reference to FIG. 1, $$y_1 = z^{-2}x + (1 - z^{-1})^2 E_1, \text{ and}$$

$$y_2 = \frac{1}{C} z^{-2} y_1 - \frac{1}{C} z^{-2} E_1 + (1 - z^{-1})^2 E_2.$$

Multiplying $y_2$ by C to develop $y_3$ yields:

$$y_3 = z^{-2} y_1 - z^{-2} E_1 + C(1-z^{-1})^2 E_2.$$

Subtracting $z^{-2} y_1$ from $y_3$ to develop $y_4$ yields:

$$y_4 = -z^{-2} E_1 + C(1-z^{-1})^2 E_2.$$

Next, multipling $y_4$ by $(1-z^{-1})^2$ to develop $y_5$ yields:

$$y_5 = -z^{-2}(1-z^{-1})^2 E_1 + C(1-z^{-1})^4 E_2.$$

Then, multipling $y_1$ by $z^{-2}$ to develop $y_6$ yields:

$$y_6 = z^{-4} x + z^{-2}(1-z^{-1})^2 E_1.$$

Finally, adding $y_5$ to $y_6$ to develop $y_{out}$ leads to:

$$y_{out} = z^{-4} x + C(1-z^{-1})^4 E_2.$$

Figure 3:
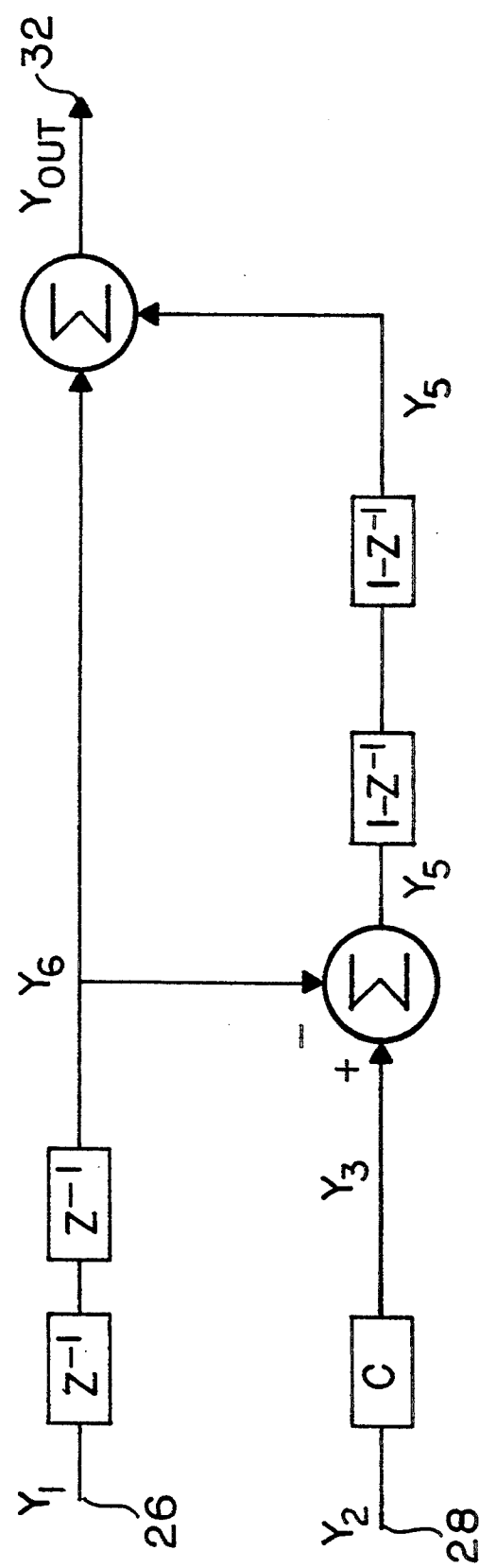
FIG. 3 is a schematic diagram of a correction network according to the teachings of the present invention.

The foregoing can be converted to block diagram form as depicted in FIG. 3. Thus, the $y_1$ and $y_2$ outputs depicted in FIG. 2 and therein labeled with reference numerals 26 and 28, respectively, which are generated in the circuit of FIG. 2 when an input x (labeled with reference numeral 30) is applied to it, can be corrected with the circuit of FIG. 3 to yield an overall output $y_{out}$ 32 that is a function only of the input x 30 and $E_2$ (which is fourth-order shaped).

Figure 4:
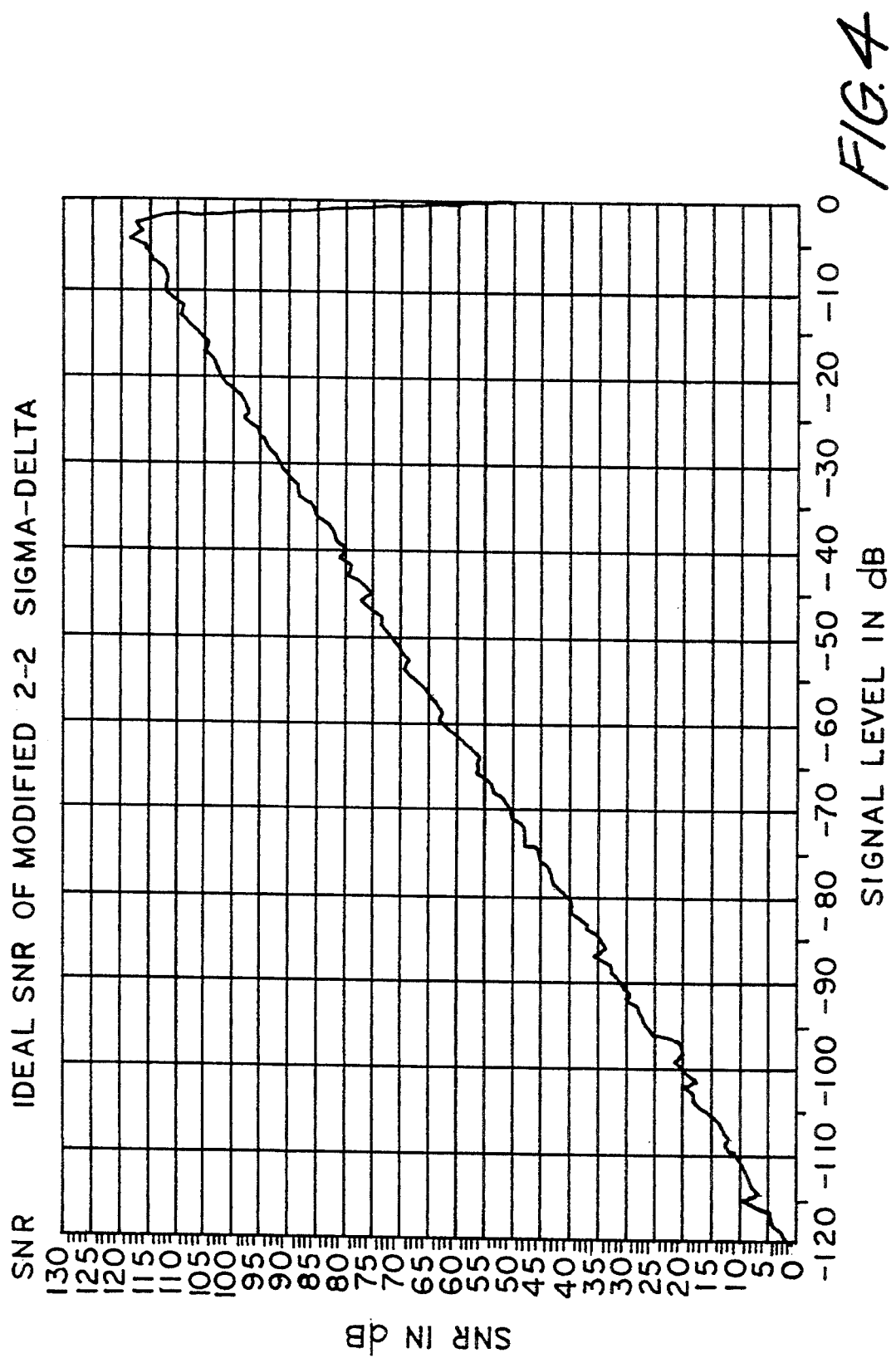
FIG. 4 is a plot of simulated SNR performance for an embodiment of the present invention.

Referring now to FIG. 4, there is shown a plot of simulated SNR performance for a "modified 2-2" modulator according to the teachings of the present invention. This plot shows remarkably good performance by an embodiment of the present invention.

Based upon the foregoing, those skilled in the art should understand and appreciate that the present invention provides a fourth-order sigma-delta modulator comprising two second-order modulators. The provided modulator differs from the prior art in several respects, which generally reduce number of parts and cost, and simplify construction and manufacturing. More specifically, in embodiments of the present invention, only the input to the first quantizer is fed to the input of the second second-order loop. This differs from prior art systems wherein an error signal is first developed by taking the difference between the input of the first quantizer and the output of the first quantizer, and wherein that error signal is then fed to the input of the second second-order loop. Also, embodiments of the present invention include correction logic which removes both the quantization noise from the first loop as well as the output from the first loop.

Obviously, numerous modifications and variations are possible in view of the above teachings. These include, but are not limited to, scaling before and after each stage of integration to prevent clipping and/or the use of multi-level quantizers. Accordingly, within the scope of the appended claims, the present invention may be practiced otherwise than is specifically described hereinabove.

What is claimed is:

1. A method of cascading a preceding second-order sigma-delta modulator having a quantizer and a subsequent second-order sigma-delta modulator, said cascading method comprising the steps of:

applying an input signal to both the preceding modulator quantizer and the subsequent modulator;

scaling a subsequent modulator output signal by a predetermined factor;

delaying a preceding modulator output signal by two sampling periods to produce a delayed preceding modulator output signal;

subtracting said delayed preceding modulator output signal from said scaled subsequent modulator output signal to produce a difference output signal;

differentiating said difference output signal; and summing said delayed preceding modulator output signal and said differentiated difference output signal to provide a circuit output signal.

2. A sigma-delta modulator system comprising:

a preceding second-order sigma-delta modulator having a quantizer;

a subsequent second-order sigma-delta modulator;

means for applying an input signal to both said preceding modulator quantizer and said subsequent modulator;

means for scaling a subsequent modulator output signal by a predetermined factor;

means for delaying a preceding modulator output signal by two sample periods to produce a delayed preceding modulator output signal;

means for subtracting said delayed preceding modulator output signal from said scaled subsequent modulator output signal to produce a difference output signal;

means for differentiating said difference output signal; and means for summing said delayed preceding modulator output signal and said differentiated difference output signal to provide a circuit output signal.

* * * * *